United States Patent [19]

Holzl et al.

[11] 4,427,445

[45] Jan. 24, 1984

[54] TUNGSTEN ALLOYS CONTAINING A15 STRUCTURE AND METHOD FOR MAKING SAME

[75] Inventors: Robert A. Holzl, La Canada; Robert E. Benander, Lakeview Terrace; Robert D. Davis, Costa Mesa, all of Calif.

[73] Assignee: Dart Industries, Inc., Northbrook, Ill.

[21] Appl. No.: 399,201

[22] Filed: Jul. 21, 1982

Related U.S. Application Data

[63] Continuation-in-part of Ser. No. 289,120, Aug. 3, 1981, which is a continuation-in-part of Ser. No. 84,791, Oct. 15, 1979, abandoned.

[51] Int. Cl.$^3$ .................................................. B22F 7/04
[52] U.S. Cl. .......................................... 75/234; 75/236; 75/248
[58] Field of Search ........................... 75/234, 236, 248

[56] References Cited

U.S. PATENT DOCUMENTS

| | | |
|---|---|---|
| 3,368,914 | 2/1968 | Darnell et al. |
| 3,565,676 | 2/1971 | Holzl |
| 3,574,672 | 4/1971 | Tarver |
| 3,640,689 | 2/1972 | Glaski et al. |
| 3,814,625 | 6/1974 | Lewin |
| 4,147,820 | 4/1979 | Holzl |
| 4,162,345 | 7/1979 | Holzl ............................... 428/328 |

FOREIGN PATENT DOCUMENTS 1540718  3/1975  United Kingdom .

OTHER PUBLICATIONS

N. J. Archer and K. K. Yee, "Chemical Vapour Deposited Tungsten Carbide Wear-Resistant Coatings Formed at Low Temperatures", Wear, vol. 48, pp. 237–250 (1978).

N. J. Archer, "Tungsten Carbide Coatings on Steel" Proceedings of the Conference on Chemical Vapour Deposition, Fifth Int'l. Conference 1975, The Electrochemical Society, Inc., Princeton, N.J.

*Primary Examiner*—Brooks H. Hunt
*Assistant Examiner*—Anne Brooks
*Attorney, Agent, or Firm*—Fitch, Even, Tabin & Flannery

[57] ABSTRACT

A hard fine-grained internally stressed material of tungsten and carbon or tungsten, carbon and oxygen is described which is produced by thermochemical deposition. The material consists primarily of a two phase mixture of pure tungsten and an A15 structure, is free of columnar grain distribution, and has a hardness of greater than 1,200 VHN. The average grain size is less than 0.1 micron.

8 Claims, No Drawings

TUNGSTEN ALLOYS CONTAINING A15 STRUCTURE AND METHOD FOR MAKING SAME

This application is a continuation-in-part of U.S. application Ser. No. 289,120, filed Aug. 3, 1981, which was a continuation-in-part of abandoned U.S. application Ser. No. 84,791, filed Oct. 15, 1979. This invention relates to improved tungsten-carbon materials, and to a method of producing such materials.

Tungsten carbides have been used for many years as wear-resistant materials. Such carbides are generally produced by sintering tungsten carbide with a ductile metal, such as cobalt, to produce material of acceptable hardness, strength, and toughness.

Such carbides have also been produced by chemical vapor deposition methods, such as described by Tarver in U.S. Pat. No. 3,574,672, but they have not been entirely satisfactory. In depositing tungsten carbide, two forms of the carbide are most frequently produced: WC or $W_2C$. Of these two forms, WC is considered to be more desirable because it is less brittle and stronger than $W_2C$. Deposits produced by the aforesaid Tarver method have been investigated and found to deposit tungsten in the form of $W_2C$. Such deposits are not suitable for many purposes because of their relative brittleness and lack of strength.

Another chemical vapor deposition method for depositing carbides is described by Lewin and Hayman in U.S. Pat. No. 3,814,625. In the Lewin and Hayman method, deposits of tungsten carbide are produced by reacting a fluoride of tungsten with a hydrocarbon and hydrogen at temperatures between 400° C. and 1000° C. Lewin and Hayman contemplate the formation of WC, $W_2C$ or mixtures thereof. However, subsequent studies by N. J. Archer have shown that only the less desirable $W_2C$ form is produced by the aforesaid Lewin and Hayman method. See "Tungsten Carbide Coatings on Steel", by N. J. Archer, Conference on Chemical Vapor Deposition, 5th International Conference 1975, The Electro Chemical Society, Princeton, New Jersey. The Archer study also indicates that the deposits of Lewin and Hayman are comprised of long crystals and columnar crystal habits, further contributing to low tensile strength.

A third form of tungsten carbide, that of $W_3C$ has been described in British patent specification No. 1,540,718, published Feb. 14, 1979, and in *Wear*, Volume 48, pp. 237-250, 1978, N. J. Archer and others. This material, which had been earlier characterized by x-ray diffraction spectra, had been referred to as beta tungsten or A15 tungsten structure (Hermann, et al, Structurbericht, Vol. 2, 1928), and had been thought by these earlier investigators to be $W_3O$. The deposits of Archer et al were formed by chemical vapor deposition using tungsten hexafluoride and either benzene, toluene or xylene. Although suitable for some applications, these deposits had relatively large, elongated grains with a columnar arrangement. Accordingly, the deposits were of relatively low tensile strength and exhibited lateral cracking at deposit thicknesses exceeding 50 micrometers.

In U.S. Pat. No. 4,162,345 issued July 24, 1979, by Robert A. Holzl, one of the applicants herein, a method is described for producing deposits of tungsten and carbon or molybdenum and carbon which results in deposits of unusually high hardness and tensile strength. Such deposits are characterized by a structure which is free of columnar crystals and instead consists essentially of fine, equiaxial crystals. The hardness, strength, and flexibility of these deposits are greatly improved over prior art deposits of tungsten carbide such as those described above.

In the method described in the Holzl patent, a gaseous volatile halide is reacted off the substrate surface with a gaseous organic compound containing carbon, hydrogen and oxygen in a substitution reaction to form intermediate products. At least some of the intermediate products are thereafter reacted with hydrogen gas at the heated surface of the substrate.

The method described in the Holzl patent has proven to be very successful in producing deposits having superior mechanical properties. If, however, there is a substantial difference in the coefficient of expansion between the deposit and the substrate, it becomes desirable to be able to produce such deposits at the lowest temperatures possible. As the substrate containing the deposit is cooled to ambient temperatures both the substrate and the deposit shrink. If the coefficient of thermal expansion for the deposit is substantially different from that of the substrate, the substrate and deposit will shrink at different rates. When cooled from relatively high temperatures this can set up a condition of stress at the boundary between the deposit and substrate which may affect the adherence of the deposit to the substrate. This may not be a problem, and in fact may be advantageous, if the deposit is to be separated from the substrate to comprise a free-standing product. However, if it is desired that the deposit and substrate should remain a unitary structure, poor adherence can be a significant problem.

Another problem associated with high substrate temperatures arises in connection with metallic substrates, such as steel and cemented tungsten carbide. At temperatures above about 550° C., a steel substrate may be distorted in shape due to stress relief or weakened due to annealing or metallurgical transformation. Cemented tungsten carbide may also be degraded in its mechanical properties at temperatures exceeding about 650° C. Weakening of the underlying substrate may not be a problem if the end product is to be a free-standing body which is removed from the substrate, but it may be a problem if the end product is to be a substrate coated with a hard alloy deposit.

Accordingly, one object of the present invention is to provide hard and strong deposits of an alloy of tungsten and carbon which are produced at relatively low temperatures to reduce problems associated with differences in thermal expansion between the deposits and their substrates.

An additional object of the present invention is to produce improved deposits of an alloy of tungsten and carbon on steel or other base metal substrates at relatively low deposition temperatures to avoid any possible problems with mechanical distortion, metallurgical transformation or stress relief of the substrate.

A further object of the present invention is to produce improved deposits of an alloy of tungsten and carbon on cemented tungsten carbide substrates at relatively low deposition temperatures to avoid any possible degradation of the mechanical properties of such substrates.

A still further object of the invention is to produce deposits of an alloy of tungsten and carbon which are of improved mechanical properties.

Other objects and advantages of the present invention will become apparent from the following description.

Very generally, the thermochemically deposited product of the invention consists primarily of a mixture of tungsten and carbon or carbon and oxygen in two phases, one of which is pure tungsten and the other of which is an A15 structure. The deposit is free of columnar distribution of grains and the hardness is greater than 1200 VHN. The average grain size is less than 0.1 microns.

The invention recognizes that, within the broad teaching of the aforementioned Holzl U.S. Pat. No. 4,162,345 it is possible to obtain deposits which, although of high quality, are different under x-ray diffraction analysis from those described in that patent. Unlike the deposits described in the aforementioned Holzl patent, which contain tungsten and finely dispersed carbides of tungsten primarily in the form WC, the deposits of the present invention are primarily in the form of a mixture of tungsten and an A15 structure. Such conclusion is based on x-ray diffraction analysis using a Philips Norelco Diffractometer using nickel-filtered Cu K radiation at 35 kV and 15 mA. Diffractometer scans were obtained in the 2θ range of 30° to 105°. The average grain size of the deposit is less than 0.1 micron and the grains are in non-columnar arrangement and do not have the substantially elongated (i.e 5 to 10 times width) shape reported by Archer, supra. The material exhibits a Vickers hardness of greater than 1200 kg per sq. mm.

The so called A15 structure is a particular type of crystalline structure that occurs in many materials. For example, a chromium oxide A15 structure is reported in Transactions of the Metallurgical Society of AIME, June 1958 pp. 352 to 355 in an article by M. V. Nevitt. Tungsten based A15 structure is sometimes referred to as beta tungsten and has been characterized by various reporters as $W_3C$ or $W_3O$.

X-ray diffraction analysis indicates that the structure of the material of the invention is a mixture of pure tungsten phase and A15 structure phase. The A15 phase is either a tungsten carbide or a tungsten carbide and tungsten oxide mix. However, certain characteristics of the material have led to the conclusion that the A15 structure itself, in the material of the invention, is lower in carbon or oxygen than stoichiometric levels of $W_3C$ or $W_3O$. The structure does not form from a melt but only from vapor deposition under certain conditions. It is a metastable compound and when heat treated at between about 600°-700° C., the A15 structure decomposes or is transformed in such a way that subsequent x-ray diffraction indicates no carbon or oxygen whatsoever is present. Gravinometric analysis, however, indicates that the carbon or oxygen is still present. Moreover, although the hardness declines somewhat upon heat-treating, it is still high, having declined usually less than about 20%. The carbon or oxygen phase after heat-treating appears to be in the grains when magnified $10^6$ times. The nature of this phase is currently unknown, but is possibly an atomic dispersion. However the carbon or oxygen may also be present as an amorphous carbide or oxide film at the grain boundaries.

In any case, the percentage of carbon or oxygen in the deposits of the invention is substantially less than that found in molecular $W_3C$ or $W_3O$. For example, $W_3C$ has a weight percentage of carbon of about 2.1%. On the other hand, the carbon present in the deposits of the invention appears to be less than about 1% and may be as low as 0.1%. Moreover, the amount of carbon does not appear to be directly proportional to hardness or to the amount of A15 structure present in the deposit. It is also noted that upon heat-treating, there is a substantial exotherm indicating the decomposition or transformation of the A15 structure phase. This exotherm is approximately 14 kilocalories per gram and appears to have no direct relation to the actual carbon or oxygen content by weight of the material.

The deposition conditions described below, are also selected to avoid a volume fraction of A15 structure which is too low. Too low a volume fraction of A15 structure results in a hardness value in the deposit which is too low to be useful. The lowest useful hardness value is typically about 1200 Vickers and necessitates an A15 structure volume fraction in excess of about 20%.

The high hardness values of the deposits of the present invention are unexpected from a theoretical calculation based upon the so-called method of mixtures approach for a two phase material. Archer et al 1978 supra report that both $W_2C$ and $W_3C$ have hardnesses in the range of 2000-2500 VHN. If one were to use the method of mixtures to calculate the hardness of an equal volume mixture of tungsten (460 VHN) and $W_3C$ (2500 VHN) one would arrive at a hardness number of 1500 VHN. The hardness of the material of the invention, however, with an equal volume mixture of pure tungsten and A15 structure is typically over 2000 VHN and approaches 2500 VHN.

This unexpected hardness in the deposits of the invention is believed to be the result of grain refinement and internal compressive stress in the A15 phase. X ray diffraction analysis of the deposits of the invention make it possible to calculate the lattice dimension of the deposited A15 phase. It has been determined that the A15 phase in the deposits of the invention, which is a cubic structure, has a lattice spacing of 5.015 angstroms to 5.039 angstroms. This differs from the reported lattice spacing of unstressed $W_3C$ of 5.048 angstroms by Archer and Hayman in British Pat. No. 1,540,718. This difference in the lattice spacing of the A15 phase of the deposits of the invention indicates an internal compressive stress in the A15 phase of up to several thousand MegaPascals (MPa). Such an internal compressive stress is highly desirable because brittle materials are better operated in compression and because the material acts as though it is much harder than normally could be expected.

In obtaining such deposits, a flow of a gaseous fluoride of tungsten is established in a chemical vapor deposition reactor along with a flow of one or more gaseous organic compounds containing carbon oxygen and hydrogen. The gaseous organic compound is selected to have a vapor pressure of at least one Torr at 20° C. and contains less than 4 carbon atoms. The substrate is maintained at a temperature of between about 300° C. and about 650° C. A flow of hydrogen gas is also established in the reactor. The gas flows, substrate temperature, and gas temperatures at introduction into the reactor are selected to produce a two phase coating on the substrate consisting of a pure tungsten phase and an A15 structure phase in which the compressive stress, hardness, and microscopic characteristics are as stated above. Although the A15 phase may theoretically comprise only tungsten and oxygen, it has been found that some carbon in the deposit is necessary, since attempts to achieve an A15 structure using only oxygen in the gas stream have thus far been unsuccessful.

In the method of the present invention, a sequence of events is made to take place which, although similar to conventional chemical vapor deposition is not truly that. The method of the invention employes a reactor which is essentially similar to a chemical vapor deposition reactor. However, the apparatus is operated in such a manner that the typical chemical vapor deposition process does not take place. Typical chemical vapor deposition involves a single reaction by the gases in the reactor at the surface of the substrate resulting in the formation of a solid phase deposit directly on the substrate surface. Typical chemical vapor deposition results in the deposition of a coating which has relatively large grains which are arranged in a columnar crystal habit. Thus, cross-sectional metallographic examination of a typical chemical vapor deposition deposit will show columns of grains, grains usually in excess of several microns in size, arranged in columns extending perpendicular to the substrate surface. Such deposits are typically quite brittle, inasmuch as the adjacent columns of grains result in long regions of weakness which are easily fractured. Moreover, such regions are more easily attached by corrosive agents.

In the method of the present invention, following the more general method described in the Holzl U.S. Pat. No. 4,162,345, an initial reaction is caused to take place displaced from the surface of the substrate. This reaction involves a decomposition or partial reduction of the fluoride of tungsten (preferably $WF_6$) by a substitution reaction with an oxygen or oxygen-containing group derived from a gaseous organic compound containing hydrogen carbon, and oxygen. Subsequent reaction with hydrogen gas results in the formation of the final deposits.

The method of the present invention is based upon the discovery that deposits of tungsten A15 structure having high hardness and strength may be produced at temperatures at and below about 650° C. by operating with certain flow rates of the gaseous reactants which are dependent on substrate temperature and on the temperature of the gaseous reactants. Various combinations of these parameters, some of which are set forth in the following examples, are capable of producing the desired deposits.

The present invention therefore is surprising and unexpected in that improved high quality deposits may be achieved at substrate temperatures well below 650° C. Problems resulting from differences in coefficients of thermal expansion between the deposit and the substrate, and problems with respect to weakening of the substrate, are thereby avoided. Accordingly, the invention is of particular importance where the desired end product is to be a coated substrate product. The resultant deposits are a mixture of tungsten and A15 structure characterized by very small, non-columnar and non-elongated grains, and high internal compressive stress in the A15 phase. In addition to high hardness, the deposits exhibit excellent wear qualities as indicated by resistance to abrasion by sand particles. The hardness of the deposit appears to be directed related to the amount of A15 structure or phase present in the deposit. Generally speaking, the higher proportion of A15 phase in the deposit, the higher the hardness and, conversely, the lower the amount of A15 phase in the deposit, the lower the hardness. As previously mentioned, the amount of carbon or oxygen in the deposit does not appear directly related to the hardness since the A15 structure in the deposit of the invention is not stoichiometric $W_3C$ or $W_3O$.

The amount of A15 structure formed is generally related to the rate of the reaction and the preheat temperature of the gases introduced into the reactor. Thus, the higher the preheat temperature is, the higher the amount of A15 structure will typically be. Similarly, the lower the reaction rate, the greater the amount of A15 phase present in the deposit will typically be. By varying these parameters appropriately, for example, a hardness of 2300 Vickers may be obtained with carbon or carbon plus oxygen percentages of from 0.1% to 1%, by weight.

The amount of gaseous organic compound utilized, i.e. its flow rate, will generally depend upon the temperature of the substrate, the flow rate of the fluoride, the hydrogen flow rate, and the gas temperatures. For example, the ratio of oxygen atoms using methanol as the gaseous organic compound to tungsten atoms in the fluoride is preferably below about 0.04. In addition, the flow rate of gaseous organic compound is related to the amount of hydrogen flow. Generally speaking, using methanol, this ratio will be of the order of 0.005. Other gaseous organic compounds may behave somewhat differently. For example, dimethyl ether, being less reactive in decomposing of $WF_6$, may require greater concentrations for the same effect.

In addition, the amount of gaseous organic compound used is dramatically affected by the temperature at which the gases are introduced into the reactor. If the gases are preheated, the amount of gaseous organic compound required is substantially reduced. The gas temperature may be controlled by a suitable preheating grid or other heating device, but the gas temperature will also be affected by the general conditions in and around the reactor. For example, heat radiated from the substrate will affect the temperature of the incoming gases.

The initial reaction, which results in a partial decomposition of the fluoride of tungsten, involves a partial substitution of oxygen or an oxygen containing group for one or more of the fluoride atoms. As discussed above, the ratio of gaseous organic compound to the fluoride is low, with the precise ratio being dependent on the particular temperatures, pressure and reactants used in the process. The precise ratios used may be more easily characterized by the ratio of number of atoms of oxygen in the gas stream to number of atoms of tungsten in the gas stream. Generally speaking, higher ratios are allowable at higher deposition temperature and low ratios allowable at lower deposition temperature. By way of example, at 600° C., the preferred ratio is about one to three, whereas at 300° C., the preferred ratio may be as high as about one to five hundred. An oxygen to metal atom ratio of approximately one to 100 may be used to produce sufficient grain refinement at a deposition temperature of 450° C., but one to forty is preferred at this temperature. The maximum atom ratio of oxygen to metal is determined by the point where deposition is totally arrested or where the deposit becomes unuseably hard and brittle.

The hardness of the deposit may be affected by the amount of gaseous organic compound used as a reactant and also by the constituency of the organic reactant. For example, for constant ratios of organic reactant to fluoride of tungsten the resulting hardness for deposits made from acetone (having 3 atoms of carbon) are greater than those made from ethanol (which has two atoms of carbon). In turn, deposits made with ethanol are harder than those made with methanol (which has one atom of carbon). Deposits made using dimethyl ether (two atoms of carbon) are similar to those made using ethanol (also two atoms of carbon).

These results indicate that hardness is influenced substantially by the ratio of the number of carbon atoms to metal atoms in the reactant stream. For constant volume ratios of reactants this hardness variation may be as much as two-to-one. For example, a Vickers hardness of about 1000 kg/mm$^2$ might be experienced using methanol as a reactant and over 2500 kg/mm$^2$ using acetone as a reactant. Mixtures of organic materials may, in fact, be used to tailor the hardness to that desired. Any selected hardness in the range of about 1000 kg/mm$^2$ to about 3000 kg/mm$^2$ may be achieved by proper experimentation using these guidelines. The organic reactant may be selected from a group comprised of alcohols, ethers, aldehydes, and ketones.

There are certain limitations in the selection of the organic material. It is of principal importance that the organic reactant must partially decompose, and thereby be partially decomposed by the fluoride of tungsten at a temperature substantially below the substrate surface temperature, typically by 100° C. to 200° C. below. If the reaction between the fluoride and the organic reactant approaches the substrate surface temperature, the organic reactant additions to the chemical system are ineffective in producing deposits of unusual grain refinement. Ordinary chemical vapor deposits result. Further if, at more elevated temperatures, the organic reactant has not already reacted with the fluoride, it may itself pyrolize, causing the formation of carbon soot. Ethyl alcohol is a good example of a material which is quite reactive with tungsten hexafluoride and is, therefore suitable.

Another important limitation in the selection of the organic reactant is that of volatility. To achieve conventional operation of the process, materials of considerable volatility are required. This disqualifies many organic reactants. It is generally necessary that the organic compound used have a vapor pressure of at least one Torr at 20° C. In general, materials containing more than about 3 carbon atoms tend to be not sufficiently volatile. It has also been found that organic reactants containing more than about 3 carbon atoms tend to produce deposits which are overly hard and brittle. The present invention is not limited to the organic compounds mentioned above but comprehends any other organic compound which may, by routine evaluation, be found to be suitable for use in the present invention by one skilled in the art having the benefit of the present disclosure. It is preferred that there be less than four carbon atoms.

Any volatile fluoride of tungsten may be used in the present invention, providing it has sufficient volatility as to be suitable within the process parameters. It has been found that tungsten hexafluoride (WF$_6$) is best suited in the method of the invention.

In order to control heat transfer and throughput velocities, inert gases such as nitrogen, argon or helium are frequently used as diluent gases in the process.

Once the initial substitution reaction has resulted in partial decomposition of the fluoride of tungsten, a further reaction is caused to take place. This reaction occurs at or near the surface of the substrate and results in the deposition of the desired coating.

Hydrogen is used in the further reaction with the partially decomposed fluoride. Possibly other decomposition products of the initial reaction are involved. The precise sequence of reactions is not understood. It is, however, postulated that the hydrogen reacts to remove the residual fluoride out of the decomposition products of the first reaction. In any case, the result is a hard deposit of unusual strength and integrity.

The hydrogen may be injected along with the initial reactants or downstream (but upstream from the substrate, of course). The hydrogen flow rate will affect the deposition rate, all other parameters being constant. Generally, the higher the hydrogen flow rate, the faster the deposition rate. High hydrogen flow rates may, however, lead to some discontinuities or porosities in the deposits. This possibility may be reduced by raising the flow rate of the gaseous organic compound, but this will effect a corresponding increase in the brittleness of the deposit. Preferable, the ratio of hydrogen to fluoride of tungsten is less than about 10.

The deposits of the present invention are characterized by a crystal structure consisting substantially of homogenous fine and equiaxial grains having an average dimension of less than about 0.1 microns and a random distribution of phases. The latter is in contrast to the typical columnar crystal habit of conventional chemical vapor deposition. The deposits have been found to have unusually high wear resistance and unexpected hardness.

In depositing coatings of the present invention on steel or other active substrate materials, such as cast iron, titanium or aluminum, it is preferred to coat the substrate first by electrochemical deposition of a more noble material such as nickel or copper. Such coating will protect the substrate from attack by the gases used to effect the alloy deposits made by the method of the present invention.

Example I

Graphite bars 2.5 mm by 5 mm by 76 mm were mounted in an inductively heated graphite furnace inside a gas-tight quartz envelope. The bars were heated to a temperature of about 450° C. and a gaseous mixture of 200 milliliters per minute of tungsten hexafluoride, 1000 milliliters per minute of hydrogen, 4 milliliters per minute of methanol, and 3300 milliliters per minute of N$_2$ were passed into the furnace over the bars. The gas preheat temperature was 300° C. The total pressure within the system was maintained at 250 Torr and the effluent gases were exhausted from the furnace by a vacuum pump. The deposition was conducted for one hour and thereafter the flow of the reactive gases was stopped and the bars were cooled.

A bright, smooth, adherent, coherent coating was observed to have been deposited on the rods. The composition of the coating was determined by x-ray diffraction to be comprised primarily of a mixture of tungsten phase and A15 phase, 33% volume tungsten and 67% volume A15 structure. The hardness was 1820 VHN (kilograms per square millimeter) measured using a 500 gram load. The A15 structure lattice spacing was about 5.03A indicating an internal hydrostatic compressive stress of 3200 MPa. Because the graphite substrate was selected to have nearly exactly the same expansion coefficient as the coating, the indicated prestress is intrinsic to the coating.

Example II

The method of the invention was carried out on steel cylinders of 76 mm internal dia. by 2000 mm in length, coating the inside surface, preplated with approximately 5µ of nickel, as follows:

WF$_6$—200 ml/min.
H$_2$—1200 ml/min.
CH$_3$OCH$_3$ (dimethyl ether)—15 ml/min.
N$_2$—1500 ml/min.
Temperature—425° C.
Gas preheat—200° C.

Deposition was carried out for about two hours and a coating thickness of 15–18µ was obtained.

A bright, smooth, adherent, coherent coating was observed with a Vickers hardness of 2200 VHN (kilograms per square millimeter) using a 500 gram load. X-ray diffraction analysis was similar to Example I.

Example III

A wear test was carried out on the deposit of Example II using a miniature sand blast unit. Silica sand at 90 psi was directed at the samples at an angle of 22.5° for 20 minutes cumulative time. Weight loss was measured and converted to volume loss and compared to a hard chrome plated steel sample of 800µ coating which was similarly tested. The coating of the invention had a wear rate of $3 \times 10^{-4}$ cu. cm/hr. whereas the chrome plated steel had a wear rate of $313 \times 10^{-4}$ cu. cm/hr.

Tests on 26% chrome stainless steel exhibited similar results versus the coatings of the invention.

Example IV

Coatings have been produced under conditions similar to those of Example I except using the following flow rates:

WF$_6$—100 ml/min.
H$_2$—500 ml/min.
N$_2$—500 ml/min.
Ethanol—5 ml/min.
Pressure—200 torr.
Substrate Temp.—450° C.
Gas Preheat—200° C.

The deposit hardness was 2000–2500 VHN using a 500 gram load.

Example V

Using similar conditions to those of Example IV, except for a flow of 2.5 ml/min. methanol and 2.5 ml/min. dimethyl ether, the deposits had a hardness of 1500 VHN.

It may be seen therefore, that the method of the invention is capable of producing deposits of superior hardness and wear resistance at relatively low substrate temperatures. Successful results are achievable with substrates having coefficients of thermal expansion as high as about 13 micrometers per meter per °C., and thus includes ferritic and martensitic steels and cast irons, as well as precipitation hardening steels. In certain special instances where the substrate geometry is simple or when the substrate has substantial compliance because of low Young's modulus or low yield strength, substrates of higher expansion coefficients can be used.

Because of a lower deposition rate, inherently achievable in the method of the invention, better throwing power and more uniform deposits result. Lower substrate temperatures also means there is more flexibility as to methods of heating the part being coated. The extremely small and symmetrical grain size in the deposits results in an intrinsically stronger and more corrosion-resistant material. Moreover, conical grain growth structures, sometimes present in deposits made at higher temperatures, do not occur with the method of the invention. Such structures may introduce regions of weakness in a deposit.

Various modifications of the invention, in addition to those shown and described herein, will become apparent to those skilled in the art having the benefit of the present description. Such modifications are intended to fall within the scope of the appended claims.

We claim:

1. A thermochemically deposited product consisting primarily of a two phase mixture of tungsten and carbon or tungsten, carbon and oxygen, one phase being pure tungsten and the other phase being an A15 structure, said tungsten phase being present in between about twenty percent and ninety percent, said product having a carbon content in said A15 structure phase by weight greater than about 0.1 percent and less than about 1 percent, said carbon content being substantially less than the carbon content corresponding to an A15 structure consisting of W$_3$C, said product being free of columnar distribution of grains, having a hardness of greater than 1200 VHN, and having an average grain size of less than 0.1 microns.

2. A thermochemically deposited product in accordance with claim 1 wherein, upon heat treating at between about 600° C. and 700° C., said A15 structure is transformed and said hardness is maintained to at least half of its pre-heat treated hardness.

3. A thermochemically deposited product in accordance with claim 1 wherein the A15 phase is internally prestressed in compression.

4. A thermochemically deposited product in accordance with claim 3 wherein the prestress is in excess of 1000 MPa.

5. A thermochemically deposited product in accordance with claim 1 wherein the lattice spacing of the A15 phase is substantially less than 5.04A as determined by x-ray diffraction analysis.

6. A coated substrate product comprising a metal substrate having a coating thereon consisting primarily of a two phase mixture of tungsten and carbon or tungsten can carbon and oxygen, one phase being pure tungsten and the other phase being an A15 structure, said tungsten phase being present in between about twenty percent and ninety percent, said coating having a carbon content in said A15 structure phase by weight greater than about 0.1 percent and less than about 1 percent, said carbon content being substantially less than the carbon content corresponding to an A15 structure consisting of W$_3$C, said product being free of columnar distribution of grains, having a hardness of greater than 1200 VHN, and having an average grain size of less than 0.1 microns.

7. A coated substrate product in accordance with claim 4 wherein the substrate comprises a ferrous body having a coefficient of thermal expansion of less than 13 micrometers per meter per degree C.

8. A coated substrate product in accordance with claim 4 wherein the substrate comprises a cemented tungsten carbide.

* * * * *

UNITED STATES PATENT AND TRADEMARK OFFICE
CERTIFICATE OF CORRECTION

PATENT NO. : 4,427,445

DATED : January 24, 1984

INVENTOR(S) : Robert A. Holzl; Robert E. Benander and Robert D. Davis

It is certified that error appears in the above-identified patent and that said Letters Patent are hereby corrected as shown below:

Column 5, line 4, change "employes" to --employs--.

Column 10, line 48, change "can" to --and--.

Column 10, line 61, change "claim 4" to read --claim 6--.

Column 10, line 65, change "claim 4" to read --claim 6--.

Signed and Sealed this

Seventh Day of August 1984

[SEAL]

Attest:

Attesting Officer

GERALD J. MOSSINGHOFF

Commissioner of Patents and Trademarks